United States Patent
Yang et al.

(10) Patent No.: US 10,481,196 B2
(45) Date of Patent: Nov. 19, 2019

(54) IMAGE SENSOR WITH TEST REGION

(71) Applicant: SK hynix Inc., Gyeonggi-do (KR)

(72) Inventors: Yun-Hui Yang, Chungcheongbuk-do (KR); Youngwoong Do, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/957,644

(22) Filed: Apr. 19, 2018

(65) Prior Publication Data

US 2019/0094293 A1    Mar. 28, 2019

(30) Foreign Application Priority Data

Sep. 27, 2017    (KR) .................. 10-2017-0125000

(51) Int. Cl.
*G01R 31/26*    (2014.01)
*H01L 27/146*    (2006.01)

(52) U.S. Cl.
CPC .... *G01R 31/2644* (2013.01); *H01L 27/14605* (2013.01); *H01L 27/14607* (2013.01); *H01L 27/14627* (2013.01); *H01L 27/14645* (2013.01); *H01L 27/14621* (2013.01); *H01L 27/14623* (2013.01)

(58) Field of Classification Search
CPC .......... G01R 31/2644; H01L 27/14607; H01L 27/14621; H01L 27/14623; H01L 27/14627; H01L 27/14645
USPC .......................................... 257/48
See application file for complete search history.

(56) References Cited

U.S. PATENT DOCUMENTS

| 8,085,391 | B2 | 12/2011 | Machida et al. | |
|---|---|---|---|---|
| 9,232,162 | B2 | 1/2016 | Lenchenkov et al. | |
| 2006/0066922 | A1* | 3/2006 | Nishi | H01L 27/14625 358/482 |
| 2006/0138488 | A1* | 6/2006 | Kim | H01L 27/14603 257/292 |
| 2009/0101947 | A1* | 4/2009 | Lin | H01L 27/14625 257/292 |
| 2015/0070552 | A1* | 3/2015 | Lin | H04N 5/2254 348/307 |
| 2016/0021320 | A1* | 1/2016 | Pyeoun | H04N 5/369 348/302 |

* cited by examiner

*Primary Examiner* — Tong-Ho Kim
(74) *Attorney, Agent, or Firm* — IP & T Group LLP

(57) ABSTRACT

An image sensor includes a pixel array and a test region adjacent to the pixel array. Each of the pixel array and the test region include a plurality of pixels, and each of the pixels in the test region include: a substrate including a photoelectric conversion element; and a transparent layer formed over the substrate and having an inclined top surface.

20 Claims, 6 Drawing Sheets

IMAGE SENSOR WITH TEST REGION

CROSS-REFERENCE TO RELATED APPLICATIONS

This patent document claims the priority and benefits of Korean Patent Application No. 10-2017-0125000 filed on Sep. 27, 2017, the disclosure of which is incorporated herein by reference in its entirety.

TECHNICAL FIELD

Exemplary embodiments of the present invention relate to a semiconductor device fabrication technology, and more particularly, to an image sensor with a test region.

BACKGROUND

An image sensor refers to a device that converts an optical image into an electrical signal. Recently, with the development of the computer and communications industry, demand for an enhanced image sensor with a high integration density is increasing in various application fields such as in digital camera, camcorder, PCS (Personal Communication System), game machine, security camera, medical micro-camera and robot application fields.

SUMMARY

Various embodiments are directed to providing an image sensor with a test region which exhibits improved performance.

In an embodiment, an image sensor may include a pixel array and a test region adjacent to the pixel array. Each of the pixel array and the test region may include a plurality of pixels, and each of the pixels in the test region may include: a substrate including a photoelectric conversion element; and a transparent layer formed over the substrate and having an inclined top surface. Furthermore, each of the pixels in the test region may further include: a color separation element formed over the inclined top surface of the transparent layer; and a condensing element formed over the color separation element. Each of the pixels in the test region may have a no-shift structure in which the central axes of the photoelectric conversion element, the color separation element and the condensing element are aligned with each other.

The inclined top surface of the transparent layer may have an inclination angle corresponding to a value within a chief ray angle (CRA) range. Each of the pixels in the pixel array may include: a substrate including a photoelectric conversion element; a transparent layer formed over the substrate and having a flat top surface; a color separation element formed over the transparent layer; and a condensing element formed over the color separation element. Each of a plurality of pixels formed in an edge region of the pixel array may have a shift structure in which the center axes of the photoelectric conversion element, the color separation element and the condensing element are misaligned from each other. The inclined top surface of the transparent layer may have an inclination angle which is substantially equal to an incident angle of light incident on the plurality of pixels formed in the edge region of the pixel array. The plurality of pixels formed in each of the pixel array and the test region may include one or more phase difference detection pixels.

In an embodiment, an image sensor may include: a substrate including photoelectric conversion elements corresponding to a plurality of pixels, respectively; a transparent layer formed over the substrate, and having a flat first surface and an inclined second surface; and an inclination induction layer inserted between the transparent layer and the substrate, and overlapping the first surface of the transparent layer. The plurality of pixels may overlap the second surface of the transparent layer. Furthermore, each of the pixels may further include: a color separation element formed over the second surface of the transparent layer; and a condensing element formed over the color separation element. The pixel may have a no-shift structure in which the central axes of the photoelectric conversion element, the color separation element and the condensing element are aligned with each other.

The second surface of the transparent layer may have an inclination angle corresponding to a value within a CRA range. The plurality of pixels may include one or more phase difference detection pixels.

In an embodiment, an image sensor may include a pixel array and first and second test regions adjacent to the pixel array. Each of the pixel array and the first and second test regions may include a plurality of pixels and a substrate including a plurality of photoelectric conversion elements corresponding to the respective pixels. The first test region may include a first transparent layer formed over the substrate and having a flat first surface and an inclined second surface, the second test region may include a second transparent layer formed over the substrate and having a flat third surface and an inclined fourth surface, and the second surface of the first transparent layer may have a different inclination angle from the fourth surface of the second transparent layer. Furthermore, the first test region may further include a first inclination induction layer inserted between the first transparent layer and the substrate and overlapping the first surface of the first transparent layer, the second test region may further include a second inclination induction layer inserted between the second transparent layer and the substrate and overlapping the third surface of the second transparent layer, and the first inclination induction layer may have a different thickness from the second inclination induction layer. The thickness of the first inclination induction layer and the inclination angle of the second surface of the first transparent layer may be proportional to each other, and the thickness of the second inclination induction layer and the inclination angle of the fourth surface of the second transparent layer may be proportional to each other. The first and second inclination induction layers may include a light shielding material.

The inclination angle of the second surface of the first transparent layer and the inclination angle of the fourth surface of the second transparent layer may have a value within a CRA range. The pixel array may have a planar shape corresponding to a rectangle with major and minor axes, the inclination angle of the second surface of the first transparent layer may be substantially equal to an incident angle of light incident on a plurality of pixels located in an edge region of the pixel array in the major-axis direction, and the inclination angle of the fourth surface of the second transparent layer may be substantially equal to an incident angle of light incident on a plurality of pixels located in an edge region of the pixel array in the minor-axis direction. The inclination angle of the second surface of the transparent layer may be larger than the inclination angle of the fourth surface of the transparent layer. Each of the pixels in the first test region may overlap the second surface of the first transparent layer, and each of the pixels in the second test region may overlap the fourth surface of the second transparent layer. The plurality of pixels in each of the pixel array and the first and second test regions may include one or more phase difference detection pixels.

These and other features and advantages of the present invention will become apparent to those with ordinary skill in the art to which the present invention belongs from the following description in conjunction with the accompanying drawings.

DETAILED DESCRIPTION

Figure 1:
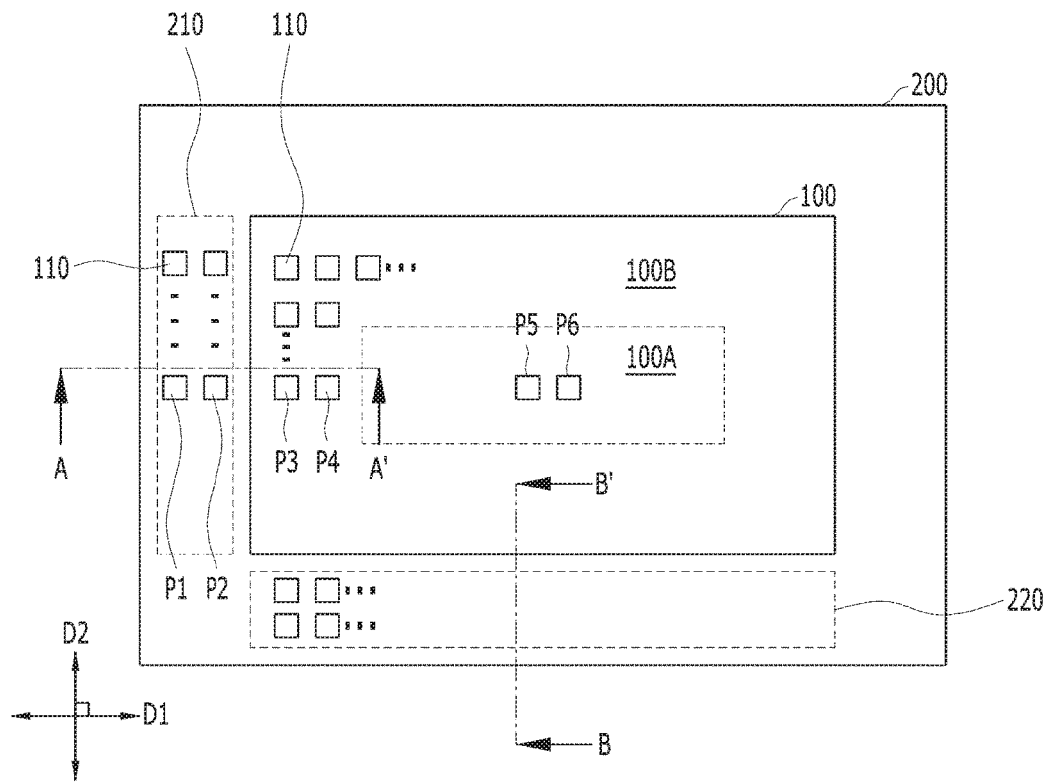
FIG. 1 is a schematic plan view of an image sensor in accordance with an embodiment.

Various examples and implementations of the disclosed technology are described below in detail with reference to the accompanying drawings. The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

An image sensor module refers to a structure in which an image sensor and a module lens are coupled. Thus, a pixel array of the image sensor may be formed in consideration of a chief ray angle (CRA) of the module lens. Specifically, the center region of the pixel array may have a no-shift structure in which the central axes of a photoelectric conversion element, a grid pattern, a color filter and a microlens are aligned with each other, and the edge region of the pixel array may have a shift structure in which the central axes of a photoelectric conversion element, a grid pattern, a color filter and a microlens are misaligned from each other. This is because incident light is irradiated vertically to the surface of the center region of the pixel array, and irradiated obliquely to the surface of the edge region of the pixel array.

The image sensor may be subjected to a probe test for evaluating its characteristics, after processing at the wafer level. The probe test is performed by irradiating incident light vertically to a wafer surface, that is, a light receiving surface of the image sensor. Therefore, the probe test can acquire a correct characteristic evaluation result from pixels formed in the center region of the pixel array, but cannot guarantee a correct characteristic evaluation result from pixels formed in the edge region of the pixel array. In other words, since a path of incident light introduced into the pixels of the edge region of the pixel array during the probe test is different from an actual path of incident light introduced into the pixels of the edge region of the pixel array in the image sensor module, the characteristics measured during the probe test may not be matched with the actual characteristics of the image sensor module. Therefore, the probe test cannot measure valid characteristics of the pixels formed in the edge region of the pixel array, which makes it difficult to correctly evaluate the quality of the image sensor. In particular, when the pixel array includes phase difference detection pixels for implementing auto focusing or three-dimensional images, it is even more difficult to correctly evaluate the quality of the image sensor.

The present invention addresses the aforementioned issue of existing image sensors. More specifically, the present invention provides an image sensor with a test region which is capable of measuring accurately the characteristics of pixels formed in an edge region of a pixel array during a probe test. In an embodiment, the test region of the image sensor includes one or more units capable of modulating the propagation direction or incident angle of incident light.

Figure 2A:
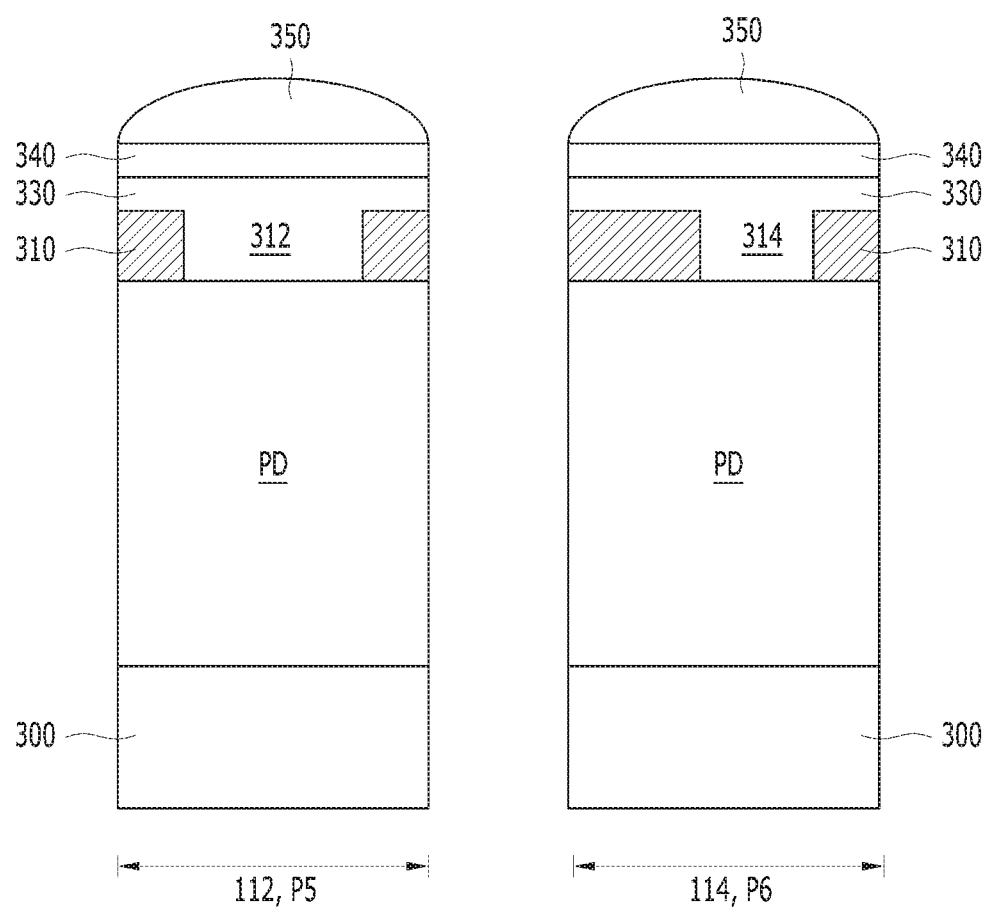
FIGS. 2A to 2C are cross-sectional views illustrating pixels of the image sensor in accordance with the present embodiment.
Figure 2B:
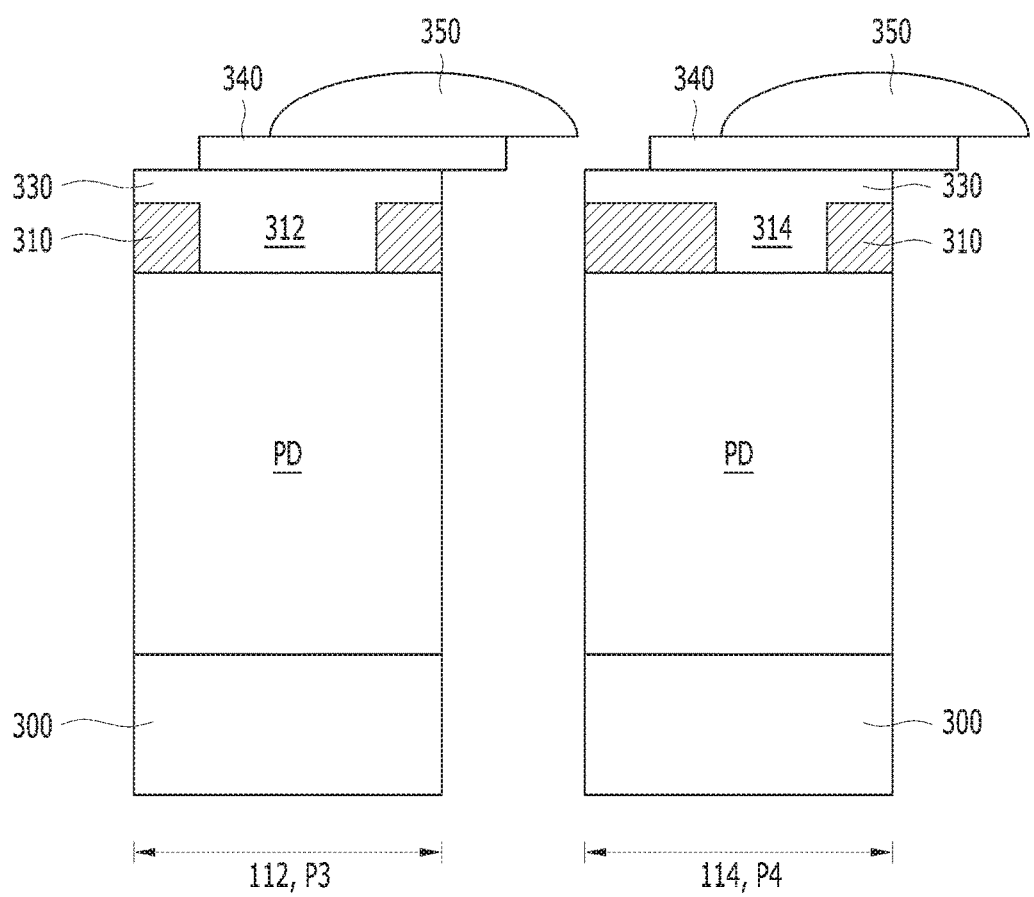
Figure 2C:
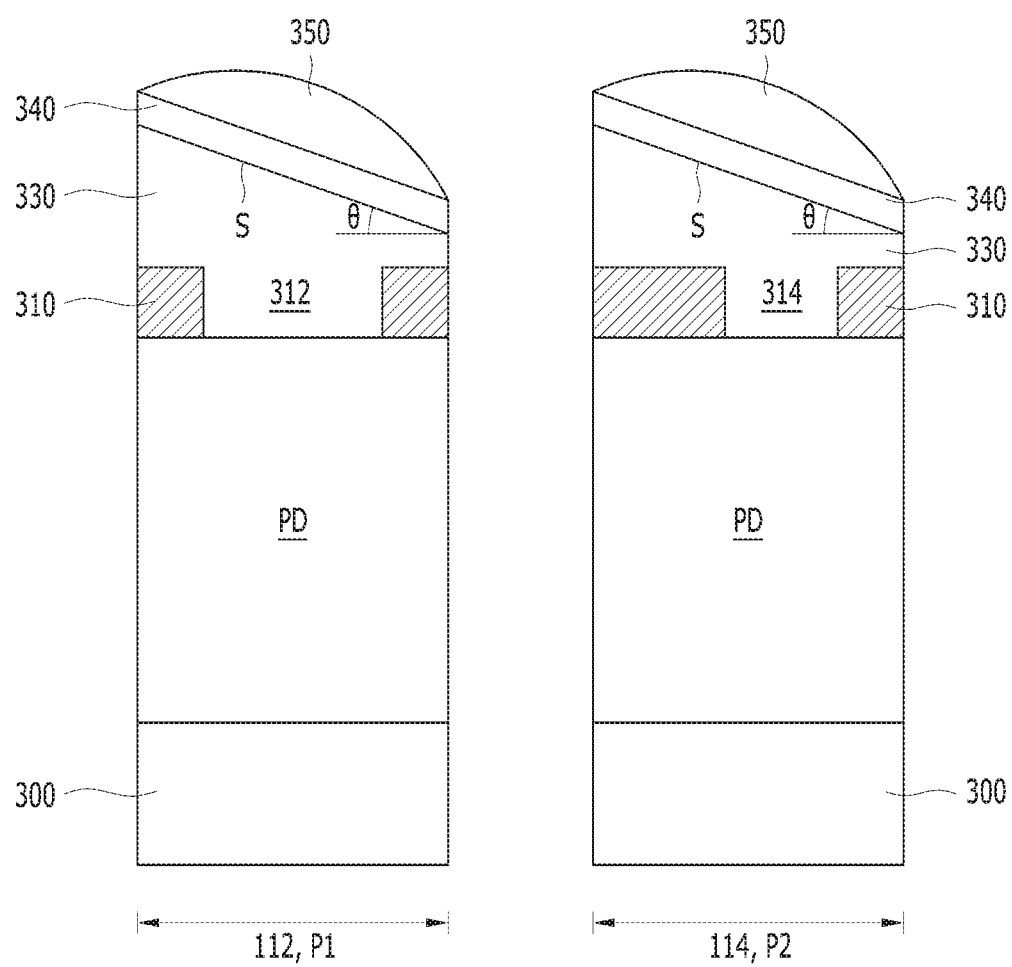

FIG. 1 is a simplified schematic plan view of an image sensor in accordance with an embodiment. FIGS. 2A to 2C are cross-sectional views illustrating pixels of the image sensor in accordance with the present embodiment. Specifically, FIG. 2A illustrates an imaging pixel and a phase difference detection pixel which are formed in the center region of a pixel array, FIG. 2B illustrates an imaging pixel and a phase difference detection pixels which are formed in an edge region of the pixel array, and FIG. 2C illustrates an imaging pixel and a phase difference detection pixel which are formed in a test region.

As illustrated in FIGS. 1 and 2A to 2C, the image sensor in accordance with the present embodiment may include the pixel array 100 and the test region 200 adjacent to the pixel array 100. For example, the test region 200 may be formed in a shape to surround the pixel array 100. Each of the pixel array 100 and the test region 200 may include a plurality of pixels 110 arranged in a matrix structure. The plurality of pixels 110 may include imaging pixels 112 and phase difference detection pixels 114. The imaging pixels 112 may serve to implement color images for an object, and the phase difference detection pixels 114 may serve to implement auto focusing or 3D images.

The pixel array 100 may have a planar shape corresponding to a rectangle with major and minor axes. The planar shape of the pixel array 100 may be based on the design rule of the image sensor. The major axis may extend in a first direction D1, and the minor axis may extend in a second direction D2 crossing the first direction D1. The first direction D1 may correspond to the row direction, and the second direction D2 may correspond to the column direction. Therefore, pixels 110 located in an edge region 100B of the pixel array 100 in the first direction D1 may have a different CRA from pixels 110 located in the edge region 100B of the pixel array 100 in the second direction D2. That is, light incident on the pixels 110 located in the edge region 100B of the pixel array 100 in the first direction D1 may have a different incident angle from light incident on the pixels 110 located in the edge region 100B of the pixel array 100 in the second direction D2.

The pixel array 100 may have a structure in which the plurality of imaging pixels 112 and the plurality of phase difference detection pixels 114 are mixed. In the pixel array 100, the number of the phase difference detection pixels 114 may be smaller than the number of the imaging pixels 112. The plurality of phase difference detection pixels 114 may be regularly or irregularly distributed in the pixel array 100. In the present embodiment, it has been described that the pixel array 100 may have a structure in which the imaging pixels 112 and the phase difference detection pixels 114 are mixed. However, the present embodiment is not limited thereto. In accordance with a modification, the pixel array 100 may include only the imaging pixels 112 or include only the phase difference detection pixels 114. In accordance with another modification, the pixel array 100 may include a first region comprising imaging pixels 112 and a second region comprising phase difference detection pixels 114.

The test region 200 may have a structure in which a plurality of imaging pixels 112 and a plurality of phase difference detection pixels 114 are mixed. The test region 200 may include an equal number of phase difference detection pixels 114 and imaging pixels 112, in order to correctly measure characteristics. The plurality of phase difference detection pixels 114 may be regularly distributed in the test region 200. In the present embodiment, it has been described that the test region 200 may have a structure in which the imaging pixels 112 and the phase difference detection pixels 114 are mixed. However, the present embodiment is not limited thereto. In accordance with a modification, the test region 200 may include only the imaging pixels 112 or include only the phase difference detection pixels 114.

Each of the pixel array 100 and the test region 200 may include a substrate 300, a grid pattern 310, a transparent layer 330, a color separation element layer 340 and a plurality of condensing element layers 350. The substrate 300 may include photoelectric conversion elements PD corresponding to the plurality of pixels 110, respectively, the grid pattern 310 may be formed on the substrate 300, the transparent layer 330 may be formed over the substrate 300 so as to cover the grid pattern 310, the color separation element layer 340 may include color filters corresponding to the respective pixels 110, and the plurality of condensing element layers 350 may include hemispherical lenses corresponding to the respective pixels 110.

The substrate 300 may include a semiconductor substrate. The semiconductor substrate may have a single crystal state, and include a silicon containing material. The substrate 300 may include a substrate thinned through a thinning process. For example, the substrate 300 may include a thinned single-crystal bulk silicon substrate. The photoelectric conversion element PD may include any one selected from a photodiode, photo transistor, photo gate and combinations thereof. For example, the photoelectric conversion element PD may include a photodiode. Specifically, the photoelectric conversion element PD may include any one of organic and inorganic photodiodes, or have a stacked structure of organic and inorganic photodiodes. The grid pattern 310 may be formed along the boundaries of the plurality of photoelectric conversion elements PD, in order to prevent an optical crosstalk between the adjacent pixels 110. Therefore, the grid pattern 310 may have a planar shape corresponding to a mesh shape. The grid pattern 310 formed in the phase difference detection pixel 114 may be expanded to overlap about half of the photoelectric conversion element PD. That is, the grid pattern 310 corresponding to the phase difference detection pixel 114 may provide an opening 314 which is formed eccentrically in the first or second direction D1 or D2.

Hereafter, the shapes of the pixels 110 depending on formation positions thereof will be described in more detail with reference to the accompanying drawings.

As illustrated in FIGS. 1 and 2A, the plurality of pixels 110 formed in the center region 100A of the pixel array 100 may include a first imaging pixel P5 and a first phase difference detection pixel P6. The first imaging pixel P5 and the first phase difference detection pixel P6 may have a structure in which the substrate 300, the photoelectric conversion element PD, the grid pattern 310, the transparent layer 330, the color separation element layer 340 and the condensing element layer 350 are sequentially stacked. The grid pattern 310 corresponding to the first imaging pixel P5 may have a first opening 312, and the grid pattern 310 corresponding to the first phase difference detection pixel P6 may have a second opening 314 which is formed eccentrically in any one direction. The first opening 312 may have a smaller area than the second opening 314. For reference, the second opening 314 may be formed eccentrically in any one direction based on the center axis of the photoelectric conversion element PD. The first opening 312 may be formed centrally over the center axis of the photoelectric conversion element PD.

The first imaging pixel P5 and the first phase difference detection pixel P6 which are formed in the center region 100A of the pixel array 100 may have a no-shift structure in which the center axes of the photoelectric conversion element PD, the grid pattern 310, the transparent layer 330, the color separation element layer 340 and the condensing element layer 350 are aligned with each other. The transparent layer 330 corresponding to the first imaging pixel P5 and the first phase difference detection pixel P6 may have a flat top surface.

As illustrated in FIGS. 1 and 2B, the plurality of pixels 110 formed in the edge region 100E of the pixel array 100 may include a second imaging pixel P3 and a second phase difference detection pixel P4. Each of the second imaging pixel P3 and the second phase difference detection pixel P4 may have a structure in which the substrate 300, the photoelectric conversion element PD, the grid pattern 310, the transparent layer 330, the color separation element layer 340 and the condensing element layer 350 are sequentially stacked. The grid pattern 310 corresponding to the second imaging pixel P3 may have a first opening 312, and the grid pattern 310 corresponding to the second phase difference detection pixel P4 may have an eccentrically formed second opening 314. The first opening 312 may have a smaller area than the second opening 314.

The second imaging pixel P3 and the second phase difference detection pixel P4 which are formed in the edge region 100B of the pixel array 100 may have a shift structure in which the center axes of the photoelectric conversion element PD, the grid pattern 310, the color separation element layer 340, and the condensing element layer 350 are misaligned from each other. For example, according to an embodiment of the shift structure, in the second imaging pixel P3 and the second phase difference detection pixel P4, the axes of the photoelectric conversion element PD, the color separation element layer 340, and the condensing element layer 350 may be misaligned each other. The transparent layer 330 corresponding to the second imaging pixel P3 and the second phase difference detection pixel P4 may have a flat top surface. That is, the transparent layer 330 corresponding to the pixel array 100 may have a flat top surface.

As illustrated in FIGS. 1 and 2C, the plurality of pixels 110 formed in the test region 200 may include a third imaging pixel P1 and a third phase difference detection pixel P2. Each of the third imaging pixel P1 and the third phase difference detection pixel P2 may have a structure in which the substrate 300, the photoelectric conversion element PD, the grid pattern 310, the transparent layer 330, the color separation element layer 340 and the condensing element layer 350 are sequentially stacked. The grid pattern 310 corresponding to the third imaging pixel P1 may have a first opening 312, and the grid pattern 310 corresponding to the third phase difference detection pixel P2 may have an eccentrically formed second opening 314. The first opening 312 may have a smaller area than the second opening 314. The areas of the first openings 312 of the first to third imaging pixels P5, P3 and P1 may be equal to each other. The areas of the second openings 314 of the first to third phase difference detection pixels P6, P4 and P2 may be equal to each other.

The third imaging pixel P1 and the third phase difference detection pixel P2 which are formed in the test region 200 may have a no-shift structure in which the center axes of the photoelectric conversion element PD, the grid pattern 310, the color separation element layer 340 and the condensing element layer 350 are aligned with each other, like the first imaging pixel P5 and the first phase difference detection pixel P6 which are formed in the center region 100A of the pixel array 100. The top surface S of the transparent layer 330 is inclined at an inclination angle θ. The color separation element layer 340 and the condensing element layer 350 may also be inclined with the same inclination angle θ as shown in FIG. 2C. The third imaging pixel P1 and the third phase difference detection pixel P2 have a no-shift structure, which makes it possible to simplify the factors that modulate a propagation path of incident light. In other words, only the inclination angle θ of the top surface S of the transparent layer 330 may be used as a factor that modulates a propagation path of the incident light. The inclination angle θ of the top surface S of the transparent layer 330 can be adjusted in order to measure the characteristics of the pixels 110 corresponding to all locations within the pixel array 100, which have different incident angles.

The test region 200 may be used to measure characteristics corresponding to the characteristics of the pixels 110 formed in the edge region 100B of the pixel array 100 during a probe test which is performed in an environment where incident light is vertically irradiated. For this operation, the transparent layer 330 corresponding to the third imaging pixel P1 and the third phase difference detection pixel P2 may have an inclined top surface S. Although incident light is vertically irradiated during the probe test, the propagation direction of the incident light may be modulated by the inclined top surface S of the transparent layer 330. Therefore, light introduced into the photoelectric conversion element PD of the third imaging pixel P1 and the photoelectric conversion element PD of the third phase difference detection pixel P2 may be obliquely incident with a predetermined incident angle. That is, although incident light is vertically irradiated during the probe test, the incident light can be obliquely irradiated onto the third imaging pixel P1 and the third phase difference detection pixel P2 through the inclined top surface S of the transparent layer 330. Therefore, the characteristics of the third imaging pixel P1 and the third phase difference detection pixel P2, which are measured during the probe test, may correspond to the actual operation characteristics of the plurality of pixels 110 formed in the edge region 100E of the pixel array 100, for example, the second imaging pixel P3 and the second phase difference detection pixel P4.

The inclination angle θ of the top surface of the transparent layer 330 corresponding to the third imaging pixel P1 and the third phase difference detection pixel P2 may have a value within the CRA range. That is, the inclination angle θ of the top surface of the transparent layer 330 may have a minimum value corresponding to the incident angle of light incident on the pixels 110 formed in the center region 100A of the pixel array 10, for example, the first imaging pixel P5 and the first phase difference detection pixel P6. Furthermore, the inclination angle θ of the top surface of the transparent layer 330 may have a maximum value corresponding to the incident angle of light incident on the pixels 110 formed in the edge region 100B of the pixel array 10, for example, the second imaging pixel P3 and the second phase difference detection pixel P4.

In order to more easily measure the characteristics of the pixels 110 formed in the edge region 100B of the pixel array 100 during the probe test, the inclination angle θ of the top surface of the transparent layer 330 may be substantially equal to the incident angle of light incident on the pixels 110 formed in the edge region 100B of the pixel array 100. That is, the inclination angle θ of the top surface of the transparent layer 330 may be substantially equal to the incident angle of light incident on the second imaging pixel P3 and the second phase difference detection pixel P4.

As described above, the image sensor in accordance with the present embodiment may include the test region 200 having the transparent layer 330 with the inclined top surface S. Thus, during a probe test which is performed in an environment where incident light is vertically irradiated, it is possible to measure characteristics corresponding to the characteristics of the pixels 110 formed in the edge region 100B of the pixel array 100.

Figure 3:
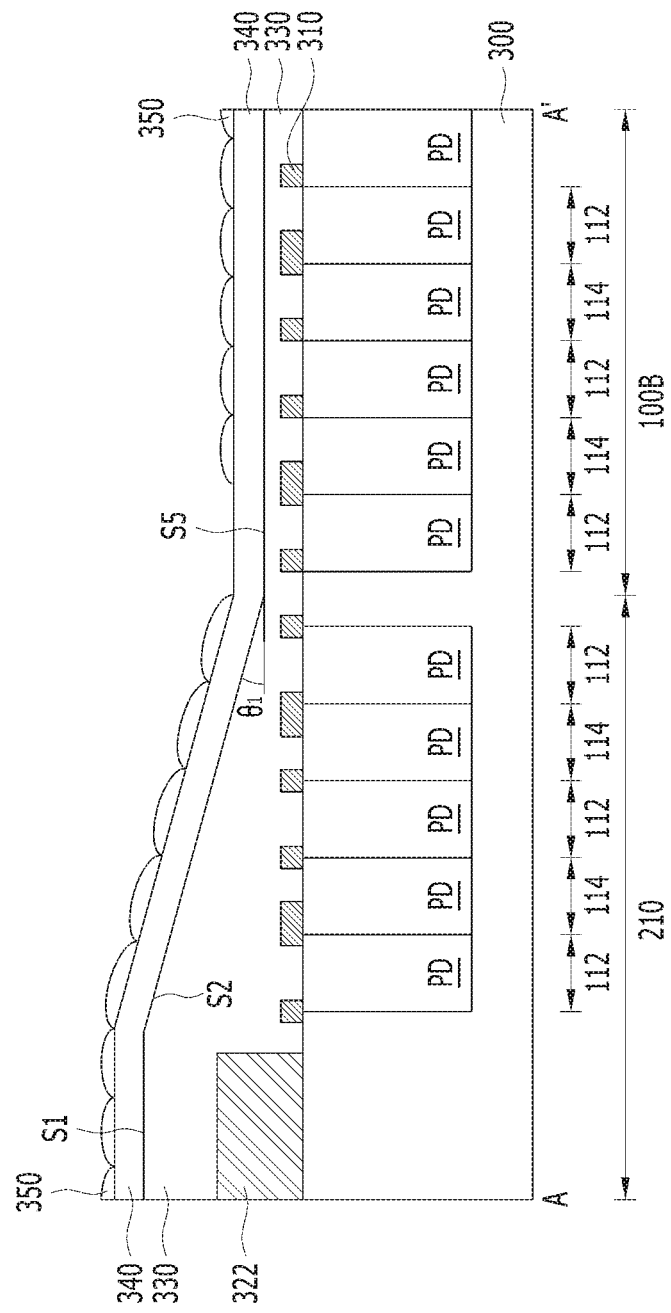
FIGS. 3 and 4 are cross-sectional views of the image sensor in accordance with the present embodiment, taken along the lines A-A' and B-B' of FIG. 1, respectively.
Figure 4:
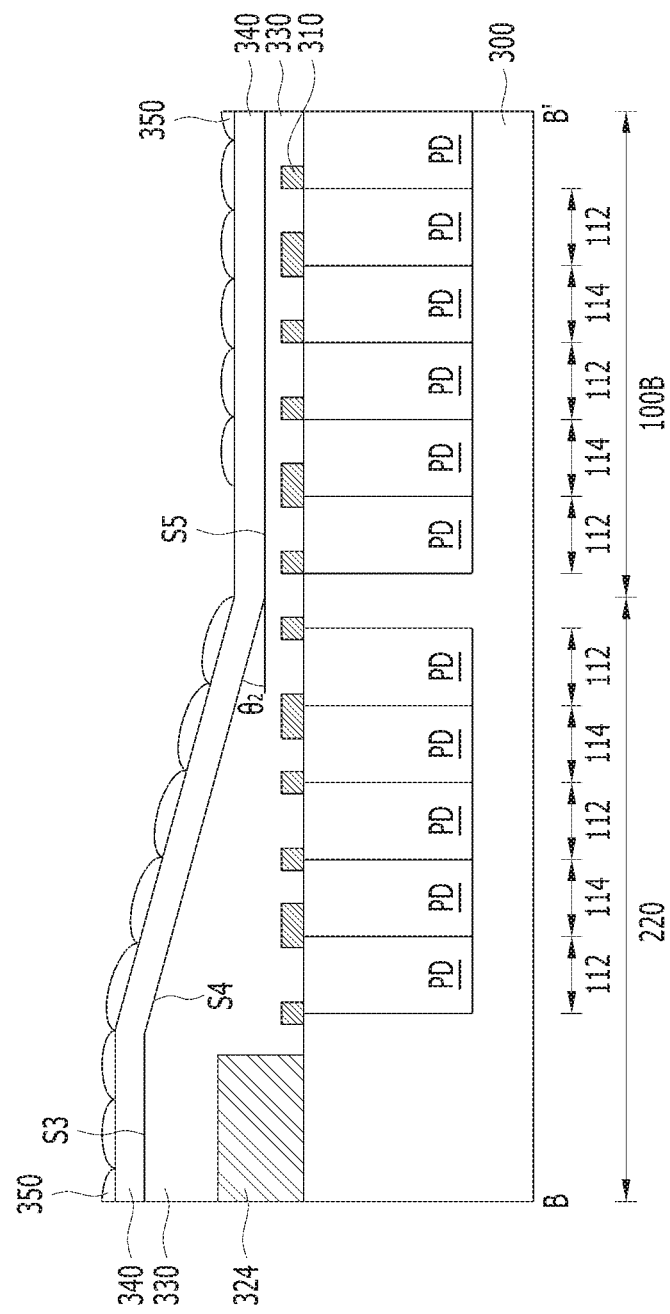

FIGS. 3 and 4 are cross-sectional views of the image sensor in accordance with the present embodiment, taken along the lines A-A' and B-B' of FIG. 1, respectively. For reference, FIGS. 2 and 3 illustrated the test region and the edge region of the pixel array. For convenience of description, the same components as those of FIGS. 1 and 2A to 2C will be represented by like reference numerals.

As illustrated in FIGS. 1, 3 and 4, the test region 200 of the image sensor in accordance with the present embodiment may be used to measure characteristics corresponding to the pixels 110 formed in the edge region 100B of the pixel array 100 during a probe test performed in an environment where incident light is irradiated vertically to the substrate 300. The test region 200 may surround the pixel array 100, and include first and second test regions 210 and 220. The first test region 210 may be adjacent to the pixel array 100 in the first direction D1, and the second test region 220 may be adjacent to the pixel array 100 in the second direction D2. The first and second test regions 210 and 220 may be used to measure characteristics based on a CRA difference in the edge region 100B of the pixel array 100, which is caused by the planar shape of the pixel array 100 during a probe test.

Referring to FIGS. 1 to 3, the first test region 210 may include a plurality of pixels 110, and the plurality of pixels 110 may include imaging pixels 112 and phase difference detection pixels 114. Each of the pixels 110 in the first test region 210 may have a no-shift structure in which the center axes of the photoelectric conversion element PD, the grid pattern 310, the color separation element layer 340 and the condensing element layer 350 are aligned with each other. The first test region 210 may include a transparent layer 330 and a first inclination induction layer 322. The transparent layer 330 may be formed on the substrate 300 and have a flat first surface S1 and an inclined second surface S2. The first inclination induction layer 322 may be inserted between the substrate 300 and the transparent layer 330 and overlap with the first surface S1 of the transparent layer 330 in a third direction. The third direction may be substantially perpendicular to the first and the second directions. In the first test region 210, the plurality of pixels 110 may overlap the second surface S2 of the transparent layer 330. The first inclination induction layer 322 may be separated from the pixel array 100 and located at the edge of the first test region 210. The first inclination induction layer 322 may include a light shielding material to prevent an optical crosstalk with the first test region 210.

The second surface S2 of the transparent layer 330 may have an inclination angle $\theta 1$ corresponding to a value within the CRA range. Preferably, the inclination angle $\theta 1$ of the second surface S2 of the transparent layer 330 may be substantially equal to the incident angle of light incident on the pixels 110 formed in the edge region 100B of the pixel array 100, adjacent to the first test region 210. Therefore, the first test region 210 can be used to measure characteristics corresponding to the pixels 110 formed in the edge region 100B of the pixel array 100, adjacent to the first test region 210, during a probe test.

The inclination angle $\theta 1$ of the second surface S2 of the transparent layer 330 may be proportional to the thickness of the first inclination induction layer 322. That is, the larger the thickness of the first inclination induction layer 322, the larger the inclination angle $\theta 1$ of the second surface S2 of the transparent layer 330. This is because of the formation process of the transparent layer 330. Specifically, since the transparent layer 330 is formed through a series of processes of forming the first inclination induction layer 322 on the substrate 300 and then depositing a transparent material, the inclination angle $\theta 1$ of the second surface S2 of the transparent layer 330 may be adjusted according to the thickness of the first inclination induction layer 322.

The edge region 100B of the pixel array 100, adjacent to the first test region 210, may have a shift structure in which the center axes of the photoelectric conversion element PD, the grid pattern 310, the color separation element layer 340 and the condensing element layer 350 are misaligned from each other. The transparent layer 330 corresponding to the edge region 100B of the pixel array 100 may have a flat top surface S5. The flat top surface S5 may be located at a lower level than the first surface S1 of the transparent layer 330, and the second surface S2 of the transparent layer 330 may be located between the first surface S1 and the flat top surface S5. The flat top surface S5 and the second surface S2 of the transparent layer 330 may be connected to each other. In other words, the first surface S1, the second surface S2 and the flat top surface S5 of the transparent layer 330 may form a single continuous surface.

Referring to FIGS. 1 and 4, the second test region 220 may include a plurality of pixels 110, and the plurality of pixels 110 may include imaging pixels 112 and phase difference detection pixels 114. Each of the pixels 110 in the second test region 220 may have a no-shift structure in which the center axes of the photoelectric conversion element PD, the grid pattern 310, the color separation element layer 340 and the condensing element layer 350 are aligned with each other. The second test region 220 may include a transparent layer 330 and a second inclination induction layer 324. The transparent layer 330 may be formed on the substrate 300 and have a flat third surface S3 and an inclined fourth surface S4, and the second inclination induction layer 324 may be inserted between the substrate 300 and the transparent layer 330, and overlap the third surface S3 of the transparent layer 330 in the third direction. In the second test region 220, the plurality of pixels 110 may overlap the fourth surface S4 of the transparent layer 330. The second inclination induction layer 324 may be separated from the pixel array 100 and located at the edge of the second test region 220. The second inclination induction layer 324 may include a light shielding material to prevent an optical crosstalk with the second test region 220.

The fourth surface S4 of the transparent layer 330 may have an inclination angle $\theta 2$ corresponding to a value within the CRA range. Preferably, the inclination angle $\theta 2$ of the fourth surface S4 of the transparent layer 330 may be substantially equal to the incident angle of light incident on the pixels 110 formed in the edge region 100B of the pixel array 100, adjacent to the second test region 220. Therefore, the second test region 220 may be used to measure characteristics corresponding to the pixels 110 formed in the edge region 100E of the pixel array 100, adjacent to the second test region 220, during a probe test.

The inclination angle $\theta 1$ of the second surface S2 of the transparent layer 330 corresponding to the first test region 210 may be different from the inclination angle $\theta 2$ of the fourth surface S4 of the transparent layer 330 corresponding to the second test region 220. For example, the inclination angle $\theta 1$ of the second surface S2 of the transparent layer 330 corresponding to the first test region 210 may be larger than the inclination angle $\theta 2$ of the fourth surface S4 of the transparent layer 330 corresponding to the second test region 220. That is because the edge region 100B of the pixel array 100 adjacent to the first test region 210 has a larger CRA than the edge region 100B of the pixel array 100 adjacent to the second test region 220. As such, the inclination angle of the top surface of the transparent layer 330 can be adjusted in order to measure a desired characteristic for each location in the pixel array 100 during the probe test.

The inclination angle $\theta 2$ of the fourth surface S4 of the transparent layer 330 may be proportional to the thickness of the second inclination induction layer 324. That is, the larger the thickness of the second inclination induction layer 324, the larger the inclination angle $\theta 2$ of the fourth surface S4 of the transparent layer 330. This is because of the formation process of the transparent layer 330. Specifically, since the transparent layer 330 is formed through a series of processes of forming the second inclination induction layer 324 on the substrate 300 and then depositing a transparent material, the inclination angle $\theta 2$ of the fourth surface S4 of the transparent layer 330 may be adjusted according to the thickness of the second inclination induction layer 324.

The first inclination induction layer 322 may have a different thickness from the second inclination induction layer 324. For example, when the inclination angle $\theta 1$ of the second surface S2 of the transparent layer 330 corresponding to the first test region 210 is larger than the inclination angle $\theta 2$ of the fourth surface S4 of the transparent layer 330 corresponding to the second test region 220, the thickness of the first inclination induction layer 322 may be larger than the thickness of the second inclination induction layer 324.

The edge region 100B of the pixel array 100, adjacent to the second test region 220, may have a shift structure in which the center axes of the photoelectric conversion element PD, the grid pattern 310, the color separation element layer 340 and the condensing element layer 350 are misaligned from each other. The transparent layer 330 corresponding to the edge region 100B of the pixel array 100 may have the flat top surface S5. The flat top surface S5 may be located at a lower level than the third surface S3 of the transparent layer 330, and the fourth surface S4 of the transparent layer 330 may be located between the third surface S3 and the flat top surface S5. The flat top surface S5 and the fourth surface S4 of the transparent layer 330 may be connected to each other. That is, the third surface S3, the fourth surface S4 and the flat top surface S5 of the transparent layer 330 may form a continuous surface.

As described above, the image sensor in accordance with the present embodiment may include the first and second test regions 210 and 220 having the transparent layers 330 of which the top surfaces have different inclination angles. Thus, during a probe test where incident light is vertically irradiated, it is possible to more correctly and effectively measure characteristics corresponding to the characteristics of the pixels 110 formed in the edge region 100B of the pixel array 100.

In accordance with the present embodiment, the image sensor may include the test region having the transparent layer with the inclined top surface capable of modulating the propagation direction or incident angle of incident light, and can measure characteristics corresponding to the characteristics of the pixels formed in the edge region of the pixel array during a probe test performed in an environment where incident light is vertically irradiated.

Although various embodiments have been described for illustrative purposes, it will be apparent to those skilled in the art that various changes and modifications may be made without departing from the spirit and scope of the invention as defined in the following claims.

What is claimed is:

1. An image sensor, comprising:
    a pixel array; and
    a test region adjacent to the pixel array, wherein each of the pixel array and the test region comprises a plurality of pixels, and
    each of the pixels in the test region comprises:
        a substrate including a photoelectric conversion element; and
        a transparent layer formed over the substrate and having an inclined planar surface.

2. The image sensor of claim 1, wherein each of the pixels in the test region further comprises:
    a color separation element formed over the inclined planar surface of the transparent layer; and
    a condensing element formed over the color separation element.

3. The image sensor of claim 2, wherein each of the pixels in the test region has a no-shift structure in which the central axes of the photoelectric conversion element, the color separation element and the condensing element are aligned with each other.

4. The image sensor of claim 1, wherein the inclined planar surface of the transparent layer has an inclination angle corresponding to a value within a chief ray angle (CRA) range.

5. The image sensor of claim 1, wherein each of the pixels in the pixel array comprises:
    a substrate including a photoelectric conversion element;
    a transparent layer formed over the substrate and having a flat top surface;
    a color separation element formed over the transparent layer; and
    a condensing element formed over the color separation element,
    wherein each of a plurality of pixels formed in an edge region of the pixel array has a shift structure in which the center axes of the photoelectric conversion element, the color separation element and the condensing element are misaligned from each other.

6. The image sensor of claim 5, wherein the inclined top surface of the transparent layer has an inclination angle which is substantially equal to an incident angle of light incident on the plurality of pixels formed in the edge region of the pixel array.

7. The image sensor of claim 1, wherein the plurality of pixels formed in each of the pixel array and the test region comprise one or more phase difference detection pixels.

8. An image sensor comprising:
    a substrate including photoelectric conversion elements corresponding to a plurality of pixels, respectively;
    a transparent layer formed over the substrate, and including a first surface having a flat surface and a second surface having an inclined planar surface; and
    an inclination induction layer inserted between the transparent layer and the substrate, and overlapping the first surface of the transparent layer,
    wherein the plurality of pixels overlap the second surface of the transparent layer.

9. The image sensor of claim 8, wherein each of the pixels further comprises:
    a color separation element formed over the second surface of the transparent layer; and
    a condensing element formed over the color separation element,
    wherein the pixel has a no-shift structure in which the central axes of the photoelectric conversion element, the color separation element and the condensing element are aligned with each other.

10. The image sensor of claim 8, wherein the second surface of the transparent layer has an inclination angle corresponding to a value within a CRA range.

11. The image sensor of claim 8, wherein the plurality of pixels comprise one or more phase difference detection pixels.

12. An image sensor, comprising:
    a pixel array; and
    first and second test regions adjacent to the pixel array, wherein each of the pixel array and the first and second test regions comprises a plurality of pixels and a substrate including a plurality of photoelectric conversion elements corresponding to the respective pixels,
    wherein the first test region comprises a first transparent layer formed over the substrate and including a first surface having a flat surface and a second surface having an inclined planar surface,
    the second test region comprises a second transparent layer formed over the substrate and including a third surface having the flat surface and a fourth surface having the inclined planar surface, and
    the second surface of the first transparent layer has a different inclination angle from the fourth surface of the second transparent layer.

13. The image sensor of claim 12, wherein the first test region further comprises a first inclination induction layer inserted between the first transparent layer and the substrate and overlapping the first surface of the first transparent layer,
    the second test region further comprises a second inclination induction layer inserted between the second transparent layer and the substrate and overlapping the third surface of the second transparent layer, and
    the first inclination induction layer has a different thickness from the second inclination induction layer.

14. The image sensor of claim 13, wherein the thickness of the first inclination induction layer and the inclination angle of the second surface of the first transparent layer are proportional to each other, and the thickness of the second inclination induction layer and the inclination angle of the fourth surface of the second transparent layer are proportional to each other.

15. The image sensor of claim 13, wherein the first and second inclination induction layers comprise a light shielding material.

16. The image sensor of claim 12, wherein the inclination angle of the second surface of the first transparent layer and the inclination angle of the fourth surface of the second transparent layer have a value within a CRA range.

17. The image sensor of claim 12, wherein the pixel array has a planar shape corresponding to a rectangle with major and minor axes, the inclination angle of the second surface of the first transparent layer is substantially equal to an incident angle of light incident on a plurality of pixels located in an edge region of the pixel array in the major-axis direction, and the inclination angle of the fourth surface of the second transparent layer is substantially equal to an incident angle of light incident on a plurality of pixels located in an edge region of the pixel array in the minor-axis direction.

18. The image sensor of claim 17, wherein the inclination angle of the second surface of the transparent layer is larger than the inclination angle of the fourth surface of the transparent layer.

19. The image sensor of claim 12, wherein each of the pixels in the first test region overlaps the second surface of the first transparent layer, and each of the pixels in the second test region overlaps the fourth surface of the second transparent layer.

20. The image sensor of claim 12, wherein the plurality of pixels in each of the pixel array and the first and second test regions comprise one or more phase difference detection pixels.

* * * * *